United States Patent [19]
Tokarz et al.

[11] Patent Number: 6,041,964
[45] Date of Patent: Mar. 28, 2000

[54] METHOD AND APPARATUS FOR SUPPLYING COMPONENTS

[75] Inventors: Ronald F. Tokarz, Owego; John I. Burgin, Jr., Binghamton, both of N.Y.

[73] Assignee: Universal Instruments Corporation, Binghamton, N.Y.

[21] Appl. No.: 08/942,935

[22] Filed: Oct. 2, 1997

[51] Int. Cl.[7] .............................. B23Q 7/04; B65G 59/04
[52] U.S. Cl. .................................. 221/211; 221/278
[58] Field of Search ..................... 221/157, 159, 221/163, 200, 211, 224, 278; 406/137

[56] References Cited

U.S. PATENT DOCUMENTS

| | | | |
|---|---|---|---|
| 3,583,599 | 6/1971 | Spisak | 221/278 |
| 4,201,313 | 5/1980 | Kirsch . | |
| 4,459,743 | 7/1984 | Watanabe et al. . | |
| 4,460,108 | 7/1984 | Noda et al. . | |
| 4,744,455 | 5/1988 | Dragotta et al. . | |
| 4,801,044 | 1/1989 | Kubota et al. | 221/163 |
| 4,953,749 | 9/1990 | Kubota et al. | 221/278 |
| 5,035,316 | 7/1991 | Coates et al. . | |
| 5,064,341 | 11/1991 | Pippin . | |
| 5,525,023 | 6/1996 | Soga et al. . | |
| 5,570,812 | 11/1996 | Ando et al. | 221/211 |
| 5,636,725 | 6/1997 | Saito et al. . | |
| 5,836,437 | 11/1998 | Saito et al. . | |
| 5,853,108 | 12/1998 | Ando et al. | 221/163 |

FOREIGN PATENT DOCUMENTS 1463433  5/1989  U.S.S.R. ............... 221/278

*Primary Examiner*—H. Grant Skaggs
*Attorney, Agent, or Firm*—Orrick, Herrington & Sutcliffe LLP

[57] ABSTRACT

A method and apparatus for supplying components wherein a plurality of components are placed on a first end of a track. The components are urged towards a second end of the track with a component stop slidingly mounted at the second end of the track. The urging of the components is discontinued and a vacuum is applied to the first component by the stop. The stop is moved away from the plurality of components to separate the first component from the remaining components.

18 Claims, 4 Drawing Sheets

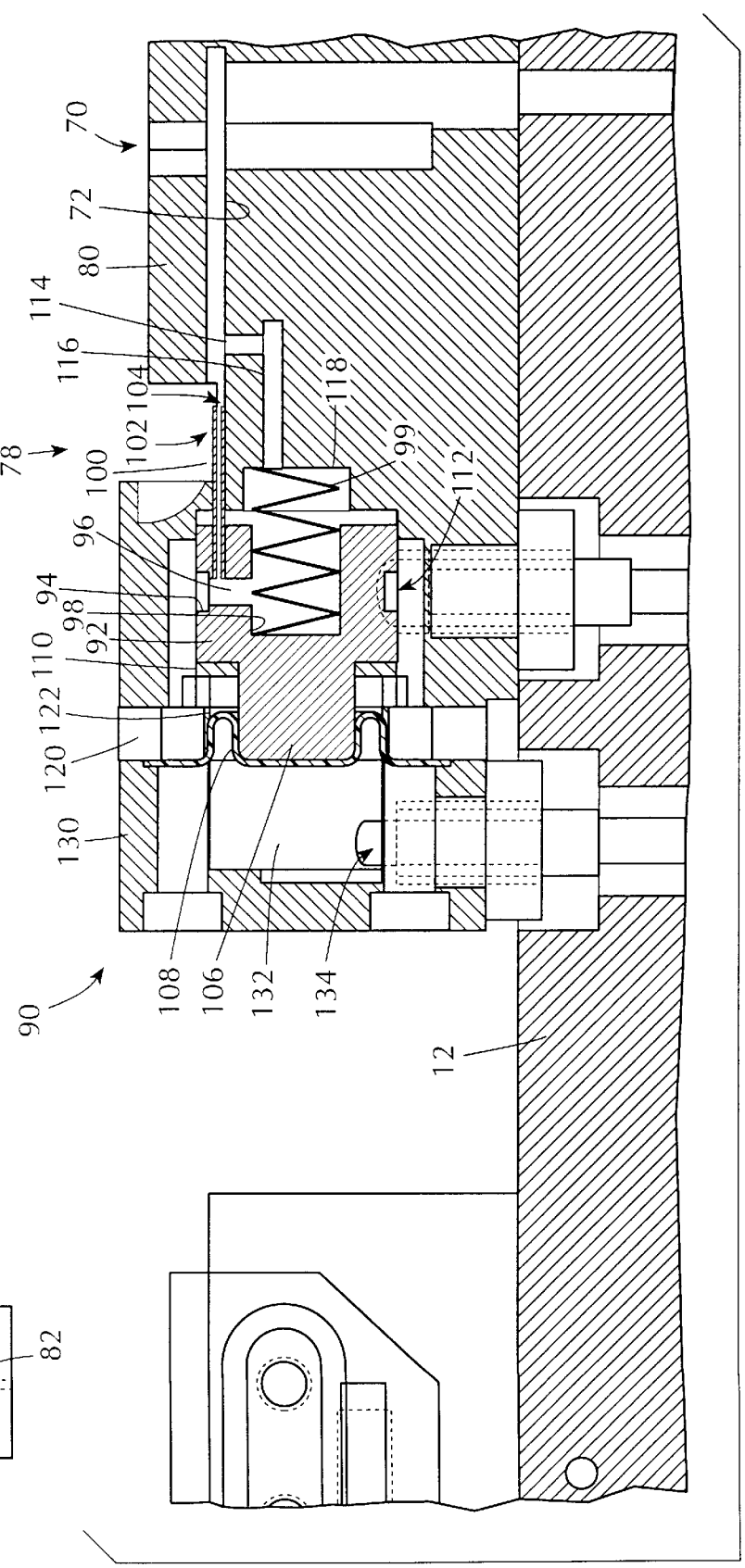
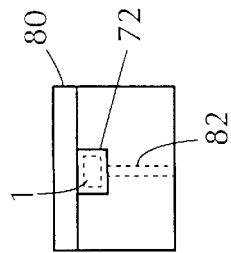
FIG. 3
FIG. 2

METHOD AND APPARATUS FOR SUPPLYING COMPONENTS

FIELD OF THE INVENTION

The present invention relates to a method and apparatus for supplying components, more particularly, to a method and apparatus for supplying components from a bulk supply and presenting them for placement by an automated component placement apparatus.

BACKGROUND OF INVENTION

There is currently a demand for devices that are capable of presenting components, such as resistors and capacitors, at a high rate of speed to automated component placement and mounting machines. Components to be placed on circuit boards are typically fed to these automated component placement machines by feeder cassettes that are adapted to supply specific types of components. These cassettes are usually of modular design so that cassettes may be interchanged and/or rearranged to provide for different supply requirements.

One type of feeder cassette that has achieved wide spread use separates individual components from a flexible support tape and presents them to the automated component placement machine. These feeders, however, suffer from the drawback that once all of the components on a reel of tape have been removed, the spent reel and the now empty tape must be removed and a new reel containing components must be mounted in its place. Because of the nature of these feeders, this task can be somewhat cumbersome and time consuming. In addition, the reels of components tend to be bulky and do not represent the most efficient means of storing components.

Recently, the supply of components from bulk containers has gained popularity. This is due to the simplicity of removing empty bulk containers and replacing them with full ones. One such bulk component feeder loads the components onto an intermittently moving conveyor belt which moves the components in a line to an output location, referred to as a presentation or pick area. A moveable stop at the presentation area limits the forward motion of the components and the belt is then halted. The stop is then moved forward, away from the line of components, and a magnet mounted to the stop draws the first component in line forward so as to clear the following component. A vacuum pick head from the automated component placement machine can then remove the first component without interference from subsequent components in the line.

These feeders, however, require that the components being supplied be attracted to the magnet, otherwise the first component will not be drawn forward by the stop. In addition, when removing components from the presentation area, the pick head of the placement machine must overcome the attraction of the component to the stop magnet. These feeders also require an excess of moving parts in order to facilitate the intermittent conveyor belt and stop mechanism.

SUMMARY OF THE INVENTION

It is, therefore, an object of the present invention to provide a component supply method and apparatus capable of quickly and reliably separating a component to be presented from a plurality of components in line to be presented.

A further object of the present invention is to provide a component supply apparatus capable of reliably separating a component to be presented from a plurality of components in line to be presented without the use of a magnet to attract the component being presented.

Another object of the present invention is to provide a component supply apparatus capable of selectively attracting a component to be presented and separating it from a plurality of components in line to be presented.

Yet another object of the invention is to provide a component supply apparatus with a minimum of moving parts.

The above and other objects are achieved in accordance with a first aspect of the present invention by an apparatus having a queue for supporting a plurality of components. Means are provided for urging the components in the queue from a first end of the queue towards a second end. A component stop is mounted proximate the second end of the queue to limit the travel of the components towards the second end of the queue. A vacuum application aperture is mounted to the stop for engaging the first component in the queue and means are provided for moving the stop so as to separate the first component in the queue from the remaining components.

In accordance with another aspect of the invention, a method is provided for supplying components, wherein a plurality of components are placed in a queue. The components are urged from a first end of the queue towards a second end. A component stop mounted at the second end of the queue stops the components and a vacuum is applied to the first component by the stop. The stop is then drawn away from the plurality of components to separate the first component from the remaining components.

These and other objects, features and advantages of the present invention will be apparent and fully understood from the following detailed description of the preferred embodiments, taken in connection with the appended drawings.

BRIEF DESCRIPTION OF THE DRAWINGS

The present invention can be better understood when considered with the following drawings wherein:

FIG. 2 is a cross-sectional view of the track of the bulk component feeder taken along line A—A of FIG. 1;

FIG. 3 is a side elevational view of the pick area of the bulk component feeder of FIG. 1 with the component stop and piston mechanism in the extended position;

DETAILED DESCRIPTION OF THE PREFERRED EMBODIMENT

Figure 1:
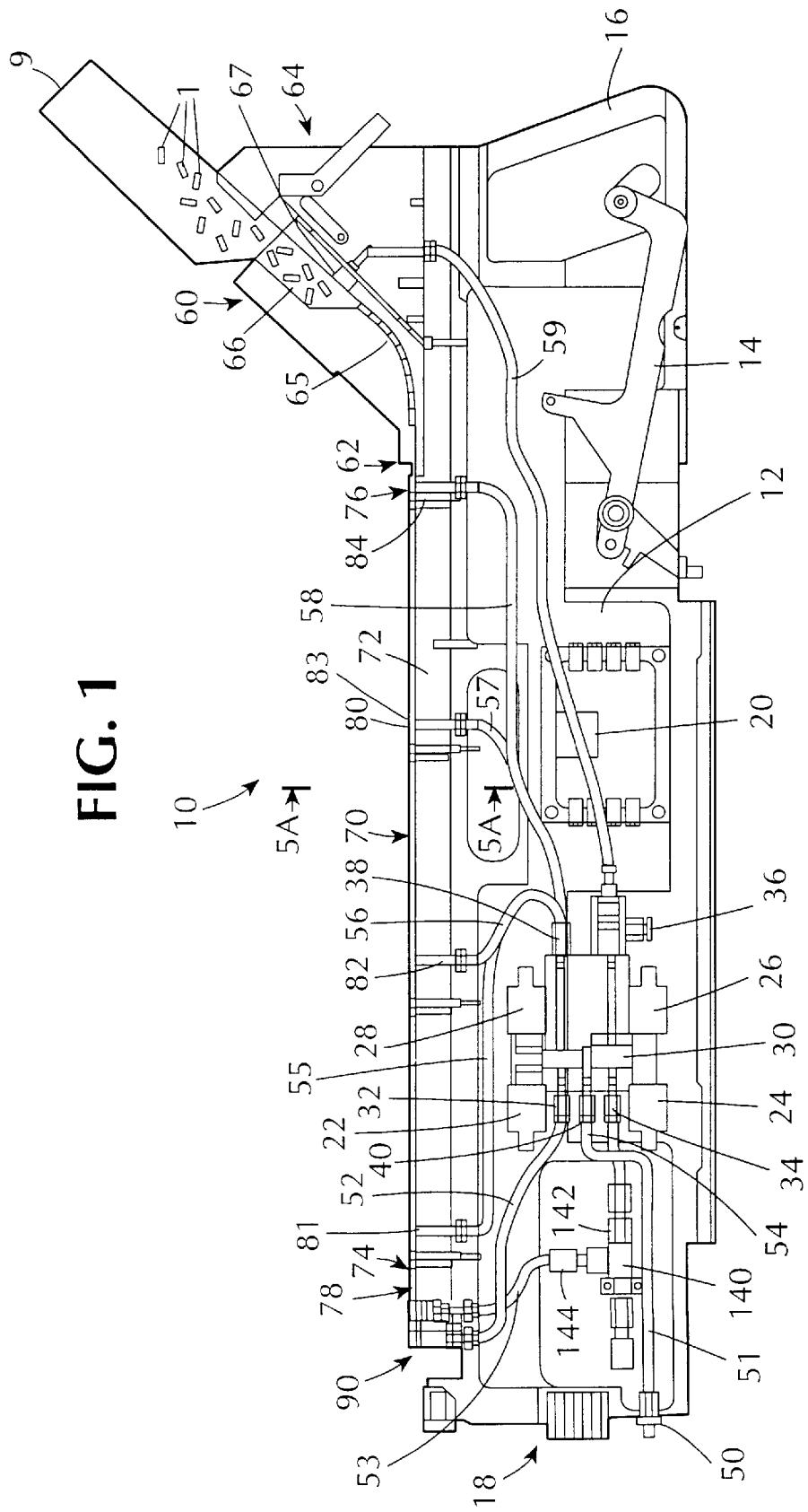
FIG. 1 is a side elevational view of the bulk component feeder according to the present invention.

Referring to FIG. 1, a component feeder 10 in accordance with the present invention is illustrated. The component feeder 10 includes a support frame 12 to which the various parts of the component feeder 10 are mounted. The frame 12 is adapted to mount to an automated component placement machine, such as model GSM-1 with one or more pick-up nozzles manufactured by Universal Instruments, the assignee of the present invention. Frame 12 includes a latch 14 assembly to secure the component feeder 10 to the GSM-1. A handle 16 mounted to the back end of the component feeder 10 helps facilitate installation and removal of the component feeder 10.

Mounted at the front end of the frame 12 are an electrical feeder interface 18 and an air supply coupling 50, both of which are adapted to link the component feeder 10 to the component placement machine. In the illustrated embodiment, these connections are the standard connections for the GSM-1 machine. The feeder interface 18 provides a power supply connection to the component feeder 10 and also provides for the required interface between the component placement machine and the electronic feeder controls 20 on the component feeder 10. This allows the component feeder 10 to receive commands from the component placement machine, for example "start feeding components," and similarly allows the component feeder 10 to send status information to the component placement machine, such as "component feeder in place."

The air coupling 50 connects the component feeder 10 to the compressed air source of the component placement machine. An air tube 51 connects the air coupling 50 to an air valve manifold 30, which is mounted centrally in the support frame 12. The air valve manifold 30 distributes the compressed air to various parts of the component feeder 10 by air tubes 52, 54, 55, 56, 57, 58, 59. The air coming out of the output ports 32, 34, 36, 38 of the manifold 30 may be individually turned on and off by solenoids 22, 24, 26, 28 mounted to the manifold 30 and controlled by the electronic feeder controls 20.

Mounted at the top of the frame 12 is a component queue 70 through which components 1 to be presented are transported to a component presentation area 78. As best seen in FIG. 2, the queue 70 of the illustrated embodiment comprises a track 72 having a cross-section adapted to support the components 1 to be transported (one of which is shown in phantom) in a desired orientation. A queue cover 80 is secured over the track 72 to seal the track 72 and retain the components 1 in the queue 70. Although the illustrated queue 70 comprises two separate pieces, it should be apparent that a single piece may be used as well. Likewise, other cross-sectional shapes and sizes may be employed, depending, at least in part, on the shape and size of the components to be fed.

Mounted to the frame 12 at the rear most end of the track 72 is a parts singulator 60. The parts singulator 60 holds a supply of components 1 provided by bulk component container 9 and deposits them one at a time into the queue 70. In the illustrated embodiment, the parts singulator 60 and bulk component container 9 are commercially available from Nitto Kogyo, a Japanese company. Bulk component container 9 is removably attached to singulator 60 permitting the restocking of chip components 1 without the need to remove the component feeder 10 from the GSM-1 machine. Inside an input chamber 66 of the singulator 60, the chip components 1 are fed from a random orientation to a predetermined and desired orientation, and are aligned into a single row in channel 65 due to the unique shape and air agitation of the Nitto Kogyo singulator 60. The components are then fed along channel 65 to the output 62 of singulator 60 by forced air from air tube 59 connected to a plenum 67 in singulator 60. At the output 62 of singulator 60 the channel 65 feeding components 1 is substantially horizontal such that the chip components 1 are fed horizontally to queue 70.

Components deposited in the track 72 are urged forward to the front end 74 of the queue by air jets. In the illustrated embodiment, four small apertures in the bottom of the track 72 operate as air jet ports 81, 82, 83, 84 to receive the compressed air from the output port 38 of manifold 30 via tubes 55, 56, 57, 58, respectively, and direct the air flow, and hence the components, towards the front end 74 of queue 70. Referring to FIG. 1, the first air jet port 84 is located at the rear end of the track 72 proximate the singulator output 62 and the remaining jet ports 81, 82, 83 are located at approximately equal intervals along track 72 with the last air jet port 81 located proximate the front end of queue 74.

The air jet ports 81, 82, 83, 84 of the illustrated embodiment are approximately 0.02 inches in diameter and angled forward at approximately 70° from vertical. The flow of air to the air jet ports 81, 82, 83, 84 is selectively turned on and off by solenoid 28 mounted to the air manifold 30. Thus, the components may be urged forward at selected times from the rear end 76 of the queue 70 to the front end 74.

Referring now to FIG. 3, the component stop assembly 90 is illustrated. As can be observed, the component presentation area 78 is merely the end portion of the track 72, which is exposed due to the cover 80 terminating before the track end. This provides access for the vacuum pick nozzle of the component placement machine to vertically remove a component in the presentation area 78 for placement and mounting.

Figure 4A:
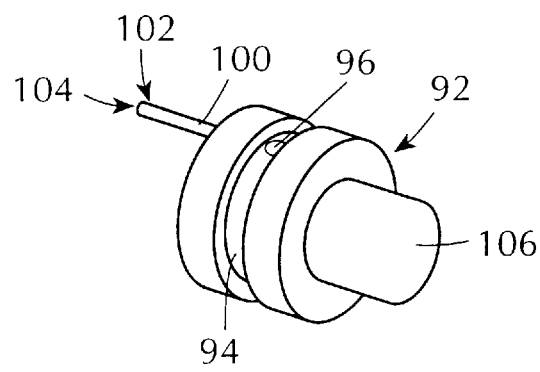
FIG. 4A is a perspective view of a stop piston according to the present invention.
Figure 4B:
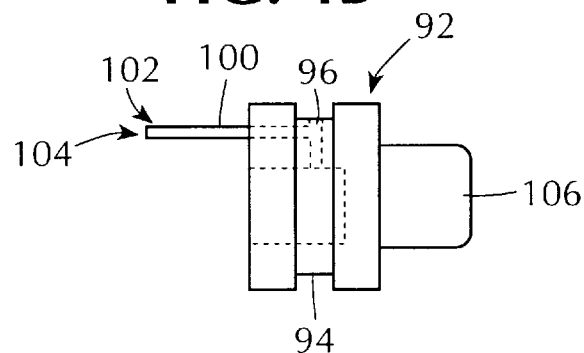
FIG. 4B is a side elevational view of the stop piston of FIG. 4A.

The stop assembly 90 is mounted to the frame 12 in front of the track 72 and component presentation area 78. As will be explained in more detail below, components fed forward by the air jets 81, 82, 83, 84 are prevented from entering the presentation area 78 by a stop 100. The stop assembly 90 includes a stop piston 92 (illustrated in detail in FIGS. 4A and 4B) disposed within a stop piston cylinder 110. The piston cylinder 110 is configured to support the stop piston 92 while allowing forward and backward motion. A spring 99 in contact with the end of the track 72 extends into a bore 98 in the stop piston 92 to retract the piston, as described below.

A groove 94 extends around the circumference of the piston 92 at about its midpoint. Within the groove 94, a vacuum aperture 96 extends into bore 98 of piston 92. A rigid nozzle-shaped component stop member 100 is mounted at the top of the end of the piston 92 proximate the presentation area 78 and extends into the piston 92 to connect with the vacuum aperture 96. The component stop end 102 extends into the presentation area 78. The component stop 100 is of such a length that when the stop piston 92 is in its extended position (FIG. 5A) the end of the stop nozzle 100 is positioned in the track 72 proximate the end of the cover 80. The cross-sectional profile of the stop nozzle 100 is such that the components being presented do not fit within the stop nozzle opening 104. Thus, when the stop piston 92 is in the extended or retracted position, the stop nozzle 100 prevents the components from entering the presentation area 78.

A vacuum port 112 is formed in the stop piston cylinder 110 at a location to align with the groove 94 in the stop piston 92 when the stop piston 92 is in the extended or retracted position (FIG. 3). The cylinder vacuum port 112 is connected by tube 53 to the vacuum port 144 of a venturi 140. The venturi 140, in turn, is connected by tube 54 to output port 34 of the air manifold 30. The flow of air to the venturi 140 is selectively turned on and off by the solenoid 24 mounted to the air manifold 30 at port 34. Thus, the flow of air to the venturi 140, and consequently the vacuum produced by it, may be selectively turned on and off. When turned on, the vacuum is communicated through the cylinder vacuum port 112 to piston groove 94 to piston vacuum aperture 96 to component stop 100.

Accordingly, applying a vacuum to the cylinder vacuum port 112 communicates the vacuum to the end 102 of the component stop 100 adjacent the first component in the track 72. The first component adheres to component stop end 102 so long as the vacuum is present. Therefore, if the vacuum is maintained while the stop piston 92 is moved to its retracted position (FIG. 5B), the first component will be drawn forward, away from the second and subsequent components in the queue 70, provided the air jets 81, 82, 83, 84 are not at the same time urging those components forward.

Figure 5A:
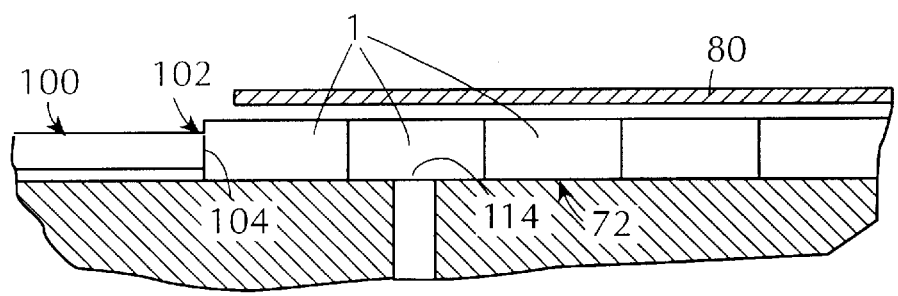
FIG. 5A is a partial section of the component presentation area with the component stop in its extended position.
Figure 5B:
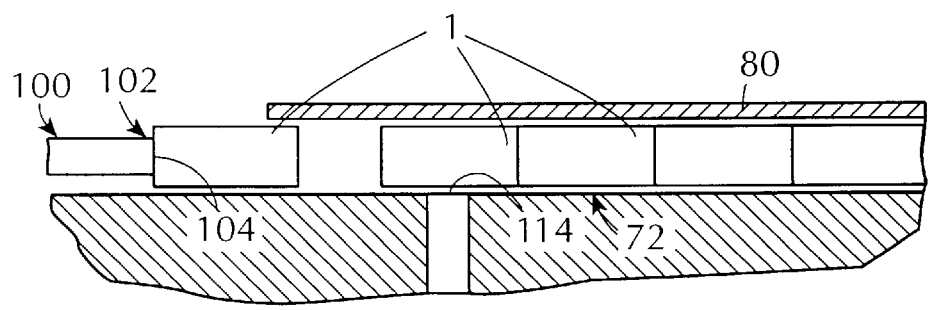
FIG. 5B is the same partial section as FIG. 5A except the urging of components has been discontinued and the component stop has been retracted with a vacuum applied through an aperture in the stop.

To aid in the separation of the first component from the second component a vacuum clamp port 114 is located proximate the bottom of the second component (FIGS. 5A and 5B). Vacuum clamp port 114 is connected to passage 116, which connects with bore 98 of piston 92 through chamber 118. Thus, when vacuum is applied to end 102 of the component stop 100, it is simultaneously applied to the bottom of the second component providing a clamping action to the second component and further helps in the separation of the first and second components.

The stop piston 92 is sealed within the stop cylinder 110 by a cylinder head 130 and a cylinder spacer 120, and the movement of the stop piston 92 is driven by air pressure. As illustrated in FIG. 3, the spacer 120 is mounted to the track 72 in front of the stop cylinder 110 and has a bore 122 extending through its center. The cylinder head 130 is mounted in front of the spacer 120 and has a corresponding bore extending partially through its center, thereby forming a piston drive chamber 132 within the cylinder head 130. A flexible, airtight diaphragm 108 is mounted between the spacer 120 and the cylinder head 130 so as to seal the piston drive chamber 132 from the stop cylinder 110.

An air inlet port 134 is formed in the piston drive chamber 132 and is connected by tube 52 to output port 32 and the flow of air to the air inlet 134 is selectively turned on and off by solenoid 22. When solenoid 22 is turned on, compressed air flows into the drive chamber 132. Consequently, the chamber 132 is pressurized and the diaphragm 108 is driven towards the stop piston 92. A knob 106 is mounted to the end of the piston 92 and contacts the diaphragm 108. Thus, when the diaphragm 108 is expanded by the compressed air in the drive chamber 132, the stop piston 92 and component stop 100 are simultaneously driven from its retracted position (FIG. 5A) to its extended position (FIG. 5B).

When the air supply to the drive chamber 132 is shut off by solenoid 22, the positive air pressure in the drive chamber 132 is allowed to dissipate and the stop piston 92 is urged back to the retracted position (FIG. 5A) by spring 99 within bore 98 and chamber 118. The inside diameter of the spacer bore 122 is smaller than the inside diameter of the cylinder 110 (and the outer diameter of the piston 92) so that when retracting, forward movement of the piston 92 is limited by the spacer 120.

Figure 6:
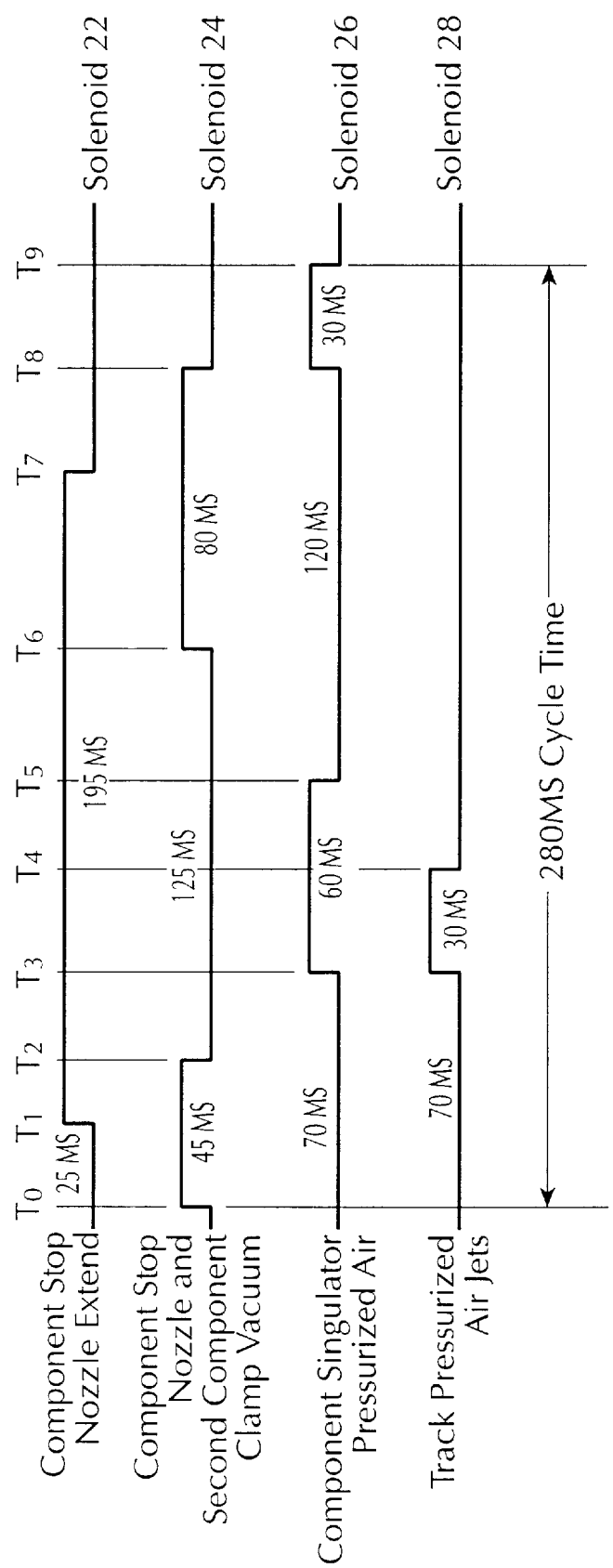
FIG. 6 is a timing diagram of the air flow solenoid activation.

Referring now to FIG. 1 and the timing diagram shown in FIG. 6, the operation of the component feeder 10 will be described. After a component 1 has been removed from the presentation area 78 the component placement machine signals the feeder 10 to obtain another component 1 in the presentation area 78. This occurs in the following sequence. At time $T_0$ (FIG. 6) solenoid 24 is activated to supply vacuum to the component stop nozzle 100 and vacuum clamp port 114. At time $T_1$ solenoid 22 is activated to provide pressurized air to extend stop piston 92 and component stop 100. At time $T_2$ solenoid 24 is deactivated. At time $T_3$ solenoids 28 and 26 are activated. Solenoid 28 provides pressurized air to air jet ports 81, 82, 83, 84 to urge the components forward in queue 70. Solenoid 26 provides pressurized air to component singulator 60.

At time $T_4$ solenoid 28 is deactivated to discontinue the pressurized air supply to the air jet ports 81, 82, 83, 84, thereby discontinuing the urging of the components. By this time the components in queue 70 have been urged forward so that another component is in contact with end 102 of extended component stop nozzle 100. At time $T_5$ solenoid 26 is deactivated. At time $T_6$ solenoid 24 is again activated to supply vacuum to component stop nozzle 100 and vacuum clamp port 114. At time $T_7$ solenoid 22 is deactivated, allowing spring 99 to retract the stop piston 92 and component stop nozzle 100. Because the vacuum is still being applied through stop nozzle opening 104 and the second component is being clamped by vacuum port 114, the first component 1 is separated from the other components in the queue 70 and moves it into the presentation area 78. At time $T_8$ solenoid 24 is deactivated, which relieves the vacuum from the component stop nozzle 100 and thus frees the component 1 now in the presentation area 78 for pick up by the placement machine vacuum nozzle. Also at time $T_8$ solenoid 26 is again activated to provide pressurized air to component simulator 60. At time $T_9$ solenoid 26 is deactivated.

Separation of the first component in the presentation area from the other components in the queue is necessary. Otherwise, the presence of the remaining components in the queue 70 abutting the first component can cause unreliable pick up for placement due to the friction of the first and second components when they are in contact with one another.

The present invention has been described in terms of illustrated embodiments thereof. Other embodiments, features and variations within the scope of the appended claims will, given the benefit of this disclosure, occur to those having ordinary skill in the art.

What is claimed is:

1. A method for supplying components comprising the steps of:
   depositing a plurality of components on a rear end of a track;
   urging said plurality of components toward a front end of said track in a first direction of movement;
   positioning a stop in front of a first component of said plurality of components so as to limit forward travel of said plurality of components at said front end of said track, said stop having a vacuum aperture;
   discontinuing the urging of at least a second component of said plurality of components;
   applying a vacuum to said first component; and
   drawing said first component of said plurality of components away from said second component into an output area by moving said stop in said first direction of movement.

2. The method of claim 1 wherein said step of urging said plurality of components towards the second end of the track comprises applying at least one jet of air to said plurality of components.

3. The method of claim 2 wherein said step of discontinuing said urging of components comprises removing the application of said at least one jet of air.

4. The method of claim 1 wherein the step of drawing said first component from said second component includes applying a clamping force to said second component.

5. An apparatus for supplying components comprising:

queue means;

means for transferring a plurality of components onto said queue means;

means for transporting said plurality of components from a first end of said queue means to a second end of said queue means in a first direction of movement;

component stop mean mounted proximate said second end of said queue means;

vacuum application means mounted to said stop means; and means for moving said component stop means in said first direction of movement so as to separate a first component of said plurality of components from a second component of said plurality of components.

6. The apparatus of claim 5 wherein said queue means comprises a track.

7. The apparatus of claim 5 wherein said transport means comprises at least one air jet.

8. The apparatus of claim 5 wherein said component stop means comprises:

a stop piston slidingly mounted to said queue;

a component stop mounted to said stop piston; and means for moving said piston.

9. The apparatus of claim 8 wherein said piston moving means comprises:

a piston driving chamber adjacent to said piston;

means for supplying air to said chamber; and a diaphragm disposed between said chamber and said piston.

10. The apparatus of claim 5 further comprising means for applying a clamping force to said second component.

11. A method for supplying components comprising:

depositing a plurality of components on a queue;

urging said plurality of components from a first end of said queue towards a second end of said queue in a first direction of movement;

stopping said plurality of components at said second end of said queue with a stop, said stop including vacuum application means;

discontinuing the urging of at least some of said plurality of components;

applying a vacuum to a first component of said plurality of components; and moving said stop in said first direction of movement, thereby drawing said first component away from said plurality of components into an output area.

12. The method of claim 11 further comprising the step of applying a clamping force to at least a second component of said plurality of components.

13. An apparatus for supplying components comprising:

a queue for holding a plurality of components to be presented;

means for transporting said plurality of components from a first end of said queue to a second end of said queue in a first direction of movement;

a component stop having a vacuum aperture mounted proximate said second end of said queue; and means for moving said component stop in said first direction of movement, so as to separate a first component of said plurality of components from a second component of said plurality of components.

14. The apparatus of claim 13 wherein said transport means comprises at least one air jet.

15. The apparatus of claim 13 further comprising means for applying a clamping force to said second component.

16. The apparatus of claim 15 wherein said means for applying said clamping force comprises a vacuum application means.

17. An apparatus for supplying components comprising;

a track for holding a plurality of components to be presented;

at least one air jet mounted proximate said track for urging said components from a first end of said track towards a second end of said track in a first direction of movement; and a component stop having a vacuum aperture mounted proximate said second end of said track, wherein said component stop is movable in said first direction of movement between a first and a second position so as to separate a first component of said plurality of components from a second component of said plurality of components.

18. The apparatus of claim 17 wherein said track includes a vacuum aperture mounted proximate the second end.

* * * * *